(12) United States Patent
Fukasaku

(10) Patent No.: US 9,991,253 B2
(45) Date of Patent: Jun. 5, 2018

(54) PROTECTION ELEMENT, PROTECTION CIRCUIT, AND SEMICONDUCTOR INTEGRATED CIRCUIT

(71) Applicant: SONY SEMICONDUCTOR SOLUTIONS CORPORATION, Kanagawa (JP)

(72) Inventor: Katsuhiko Fukasaku, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days. days.

(21) Appl. No.: 15/328,969

(22) PCT Filed: Jul. 8, 2015

(86) PCT No.: PCT/JP2015/069658
§ 371 (c)(1),
(2) Date: Jan. 25, 2017

(87) PCT Pub. No.: WO2016/017386
PCT Pub. Date: Feb. 4, 2016

(65) Prior Publication Data
US 2017/0229446 A1    Aug. 10, 2017

(30) Foreign Application Priority Data
Aug. 1, 2014   (JP) ................................ 2014-157827

(51) Int. Cl.
*H01L 23/62*       (2006.01)
*H01L 27/02*       (2006.01)
(52) U.S. Cl.
CPC ................................ *H01L 27/0285* (2013.01)
(58) Field of Classification Search
CPC ............. H01L 27/0255; H01L 27/0285; H01L 27/0251; H01L 27/0248; H01L 27/0629
(Continued)

(56) References Cited

U.S. PATENT DOCUMENTS 6,671,153 B1* 12/2003 Ker ..................... H01L 27/0255
                                                                 361/111
7,593,201 B2* 9/2009 Ishizuka ............. H01L 27/0251
                                                                 361/111
(Continued)

FOREIGN PATENT DOCUMENTS

JP       2004-014929       1/2004
JP       2006-121007       5/2006
(Continued)

OTHER PUBLICATIONS

International Search Report prepared by the Japan Patent Office dated Jul. 29, 2015, for International Application No. PCT/JP2015/069658.

*Primary Examiner* — Luan C Thai
(74) *Attorney, Agent, or Firm* — Sheridan Ross P.C.

(57) ABSTRACT

To provide a protection element in which an increase in current due to off-state leakage can be reduced while a drive current can be ensured during an ESD operation.

Provided is the protection element including: a clamp MOS transistor that has a drain coupled to a power supply line and a source coupled to a ground line; and a potential increasing circuit that increases a potential of a diffusion layer at the ground line side of the clamp MOS transistor, more than a potential of the ground line. In this protection element, the potential of the diffusion layer coupled to the ground line of the clamp MOS transistor is increased from the potential of the ground line, whereby an increase in current due to off-state leakage can be reduced while a sufficient drive current is ensured during an ESD operation.

9 Claims, 9 Drawing Sheets

(58) Field of Classification Search
USPC .......................................................... 257/363
See application file for complete search history.

(56) References Cited

U.S. PATENT DOCUMENTS

| | | | | |
|---|---|---|---|---|
| 9,058,886 | B2* | 6/2015 | Miyakawa | .......... G11C 11/1695 |
| 2011/0043955 | A1* | 2/2011 | Noda | ..................... H02H 9/046 |
| | | | | 361/56 |
| 2012/0307410 | A1* | 12/2012 | Yamazaki | ....... H01L 21/823842 |
| | | | | 361/88 |
| 2013/0228867 | A1* | 9/2013 | Suematsu | ............... H01L 23/60 |
| | | | | 257/355 |

FOREIGN PATENT DOCUMENTS

| | | |
|---|---|---|
| JP | 2012-253241 A | 12/2012 |
| JP | 2013-183072 A | 9/2013 |
| JP | 2014-135320 A | 7/2014 |

* cited by examiner

PROTECTION ELEMENT, PROTECTION CIRCUIT, AND SEMICONDUCTOR INTEGRATED CIRCUIT

CROSS REFERENCE TO RELATED APPLICATIONS

This application is a national stage application under 35 U.S.C. 371 and claims the benefit of PCT Application No. PCT/JP2015/069658 having an international filing date of 8 Jul. 2015, which designated the United States, which PCT application claimed the benefit of Japanese Patent Application No. 2014-157827 filed 1 Aug. 2014, the disclosures of which are incorporated herein by reference in their entirety.

TECHNICAL FIELD

The present disclosure relates to protection elements, protection circuits, and semiconductor integrated circuits.

BACKGROUND ART

Semiconductor integrated circuits are typically provided with an electrostatic discharge (ESD) protection circuit so that electrostatic breakdown of an internal circuit is prevented. As a typical ESD protection circuit, used is an RC-triggered power clamp metal oxide semiconductor (MOS) circuit (see, for example, Patent Literature 1). Also, another ESD protection circuit has been proposed which is configured so that an output signal of a CMOS inverter is supplied not only to the gate of a clamp MOS transistor, but also to the well (body) of the clamp MOS transistor (see, for example, Patent Literature 2).

CITATION LIST

Patent Literature

Patent Literature 1: JP 2004-14929A
Patent Literature 2: JP 2006-121007A

DISCLOSURE OF INVENTION

Technical Problem

In order to enhance the discharge ability of an ESD protection circuit, it is necessary to increase the drive current of the power clamp MOS transistor. However, it is necessary to change the size of the MOS in order to increase the drive current. The drive current can be increased by decreasing the gate length, increasing the gate width, or the like. However, the decrease of the gate length or the increase of the gate width causes off-state leakage during normal operations except for an ESD operation. Off-state leakage leads to an increase in current consumption. Therefore, there is a trade-off between the increase of the drive current of a power clamp MOS transistor and the occurrence of off-state leakage.

With the above in mind, the present disclosure proposes a novel and improved protection element, protection circuit, and semiconductor integrated circuit in which an increase in current due to off-state leakage can be reduced while a sufficient drive current can be ensured during an ESD operation.

Solution to Problem

According to the present disclosure, there is provided a protection element including: a clamp MOS transistor that has a drain coupled to a power supply line and a source coupled to a ground line; and a potential increasing circuit that increases a potential of a diffusion layer at the ground line side of the clamp MOS transistor, more than a potential of the ground line.

According to the present disclosure, there is provided a protection circuit including: a clamp MOS transistor that has a drain coupled to a power supply line and a source coupled to a ground line; a potential increasing circuit that increases a potential of a diffusion layer at the ground line side of the clamp MOS transistor, more than a potential of the ground line; a resistive element and a capacitive element that are coupled between the power supply line and the ground line; and an inverter that has an input coupled between the resistive element and the capacitive element.

According to the present disclosure, there is provided a semiconductor integrated circuit including: a clamp MOS transistor that has a drain coupled to a power supply line and a source coupled to a around line; a potential increasing circuit that increases a potential of a diffusion layer at the ground line side of the clamp MOS transistor, more than a potential of the ground line; a resistive element and a capacitive element that are coupled between the power supply line and the ground line; an inverter that has an input coupled between the resistive element and the capacitive element; and an internal circuit that is coupled between the power supply line and the ground line.

Advantageous Effects of Invention

As described above, according to the present disclosure, a novel and improved protection element, protection circuit, and semiconductor integrated circuit can be provided in which an increase in current due to off-state leakage can be reduced while a sufficient drive current can be ensured during an ESD operation.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
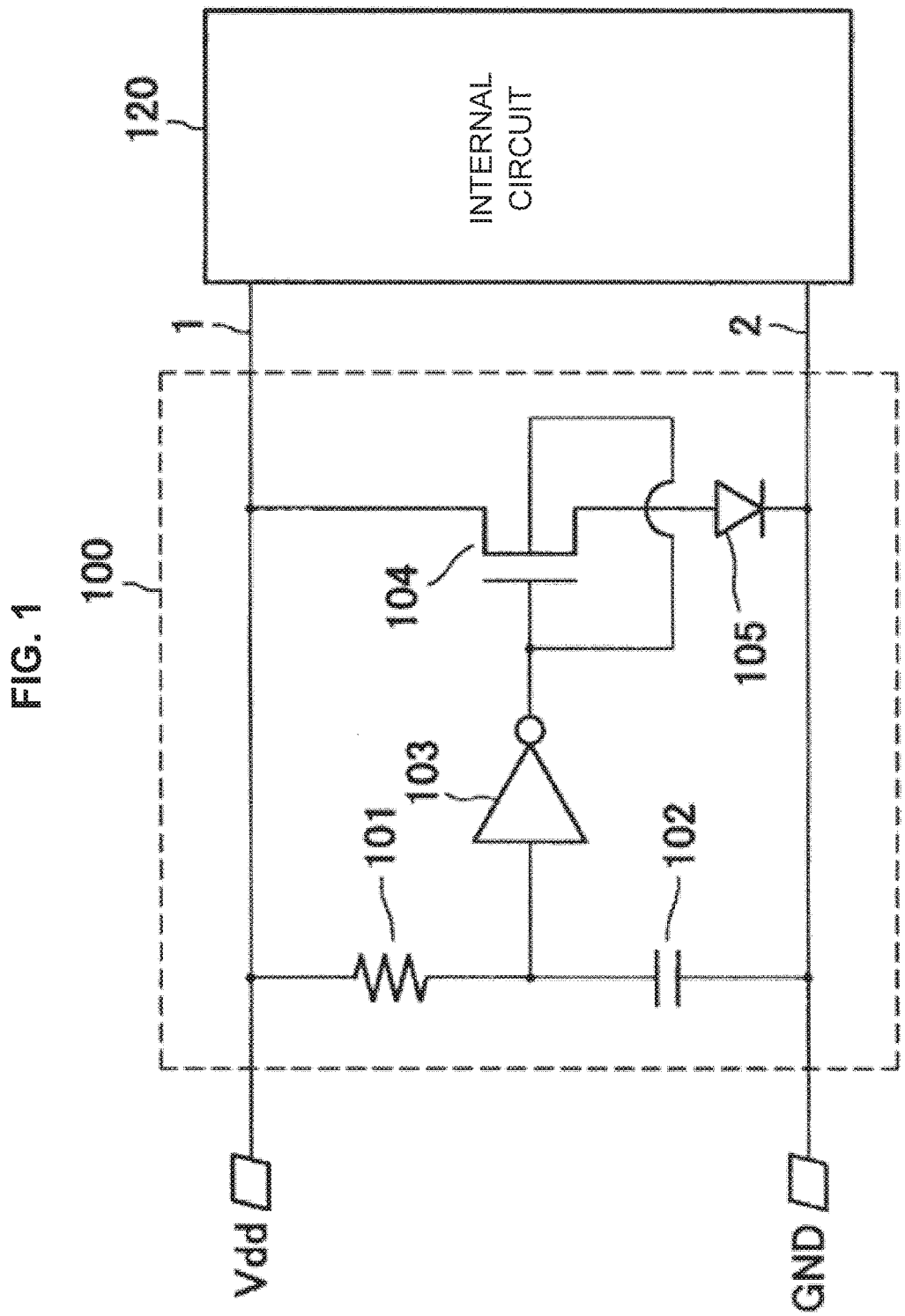
FIG. 1 is an illustrative diagram showing a circuit configuration example of an ESD protection circuit 100 according to an embodiment of the present disclosure.

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

Note that description will be provided in the following order.
1. Embodiment of the present disclosure
1.1. Overview
1.2. Circuit configuration example
1.3. Operation example
1.4. Modification
2. Conclusion

1. Embodiment of the Present Disclosure

[1.1. Overview]

An overview of an embodiment of the present disclosure will be described before the embodiment of the present disclosure is described.

As described above, a semiconductor integrated circuit is typically provided with an ESD protection circuit so that electrostatic breakdown of an internal circuit is prevented. As a typical ESD protection circuit, used is an RC-triggered power clamp MOS circuit. Also, another ESD protection circuit has been proposed which is configured so that an output signal of a CMOS inverter is supplied not only to the gate of a clamp MOS transistor, but also to the well (body) of the clamp MOS transistor.

A conventional ESD protection circuit employing an RC-triggered power clamp MOS circuit includes a series RC circuit of a resistive element and a capacitive element provided between a power supply line and a ground line, and a CMOS inverter whose input end is coupled to a coupling point between the resistive element and the capacitive element. Furthermore, the ESD protection circuit includes a clamp MOS transistor including a MOSFET of the N-type carrier conductivity type. The gate of the clamp MOS transistor is coupled to the output end of the CMOS inverter, and the drain and source of the clamp MOS transistor are coupled to the power supply line and the ground line, respectively.

Figure 9:
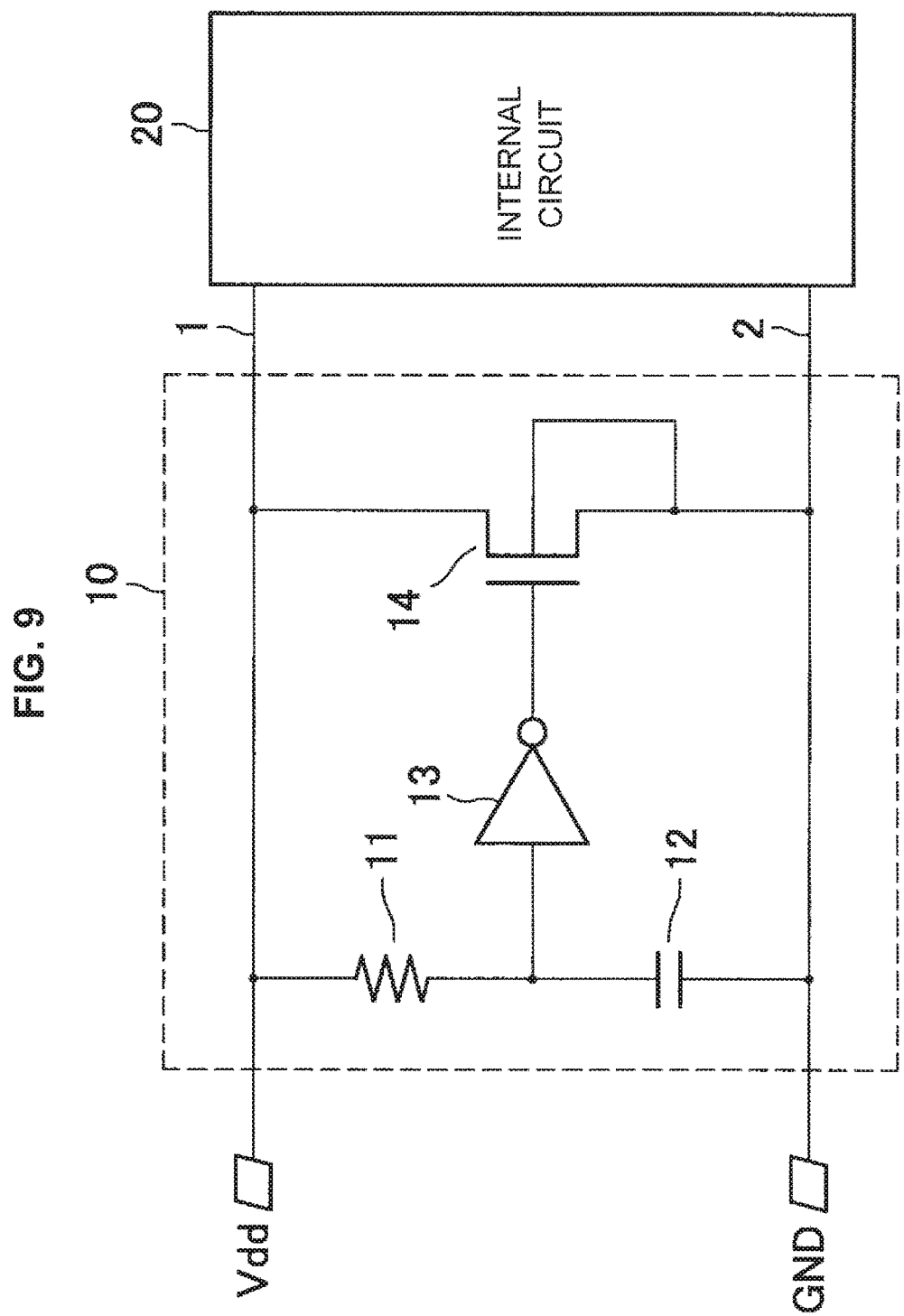
FIG. 9 is an illustrative diagram showing an example of a conventional ESD protection circuit employing an RC-triggered power clamp MOS circuit.

FIG. 9 is an illustrative diagram showing an example of the conventional ESD protection circuit employing an RC-triggered power clamp MOS circuit. The ESD protection circuit 10 shown in FIG. 9, which is a circuit for protecting an internal circuit 20 from a surge of ESD, has a resistive element 11, a capacitive element 12, a CMOS inverter 13, and a clamp MOS transistor 14, between a power supply line 1 and a ground line 2. The power supply line 1 is supplied with a power supply voltage Vdd, and the ground line 2 is coupled to a ground terminal and have a ground potential Vss.

The resistive element 11 may include, for example, a resistive element or MOSFET (variable resistive device) formed of a material, such as polysilicon or the like. In this embodiment, the resistive element 11 includes, for example, a resistive element formed of polysilicon, i.e., a resistive element having a resistance value which is constant irrespective of the presence or absence of occurrence of ESD.

Note that, as the resistive element formed of polysilicon, the gate electrode of a MOSFET formed of polysilicon may be used, for example.

The capacitive element 12 includes a capacitive element which is less bias-dependent. For example, the capacitive element 12 may include a capacitive element which employs as a capacitor a gate insulating film of a MOS transistor (e.g., an accumulation MOS transistor), a capacitive element which employs as a capacitor an insulating film between interconnection layers, or the like.

The resistance value of the resistive element 11 and the capacitance value of the capacitive element 12 may be set as appropriate so that the time constant of the series RC circuit of the resistive element 11 and the capacitive element 12 has a desired value, taking into account an application of the ESD protection circuit 10, a discharge phenomenon that is expected, or the like. As an example, the resistance value of the resistive element 11 may be set within the range of, for example, about $1000\Omega$ to $10$ M$\Omega$ as appropriate. Also, the capacitance value of the capacitive element 12 may be set within the range of, for example, about 1 pF to 10 pF as appropriate. Needless to say, the resistance value of the resistive element 11 and the capacitance value of the capacitive element 12 are not limited to those value ranges.

The CMOS inverter 13 inverts the potential (voltage signal) of the coupling point between the resistive element 11 and the capacitive element 12. Thereafter, the CMOS inverter 13 applies the inverted potential to the gate of the clamp MOS transistor 14.

The clamp MOS transistor 14 includes an N-channel MOSFET. The drain, source, and gate of the clamp MOS transistor 14 are coupled to the power supply line 1, the ground line 2, and the output of the CMOS inverter 13, respectively. Also, the drain and well of the clamp MOS transistor 14 are coupled together.

The open/close control (on/off control) of the clamp MOS transistor 14 is performed according to an output signal (output voltage) of the CMOS inverter 13. Also, a period of time during which an ESD surge current flows from the drain to the source of the clamp MOS transistor 14 (a period of time during which the clamp MOS transistor 14 is open) is determined by the time constant of a series RC circuit of the resistive element 11 and the capacitive element 12. For example, when the resistance value of the resistive element 11 is 10 M$\Omega$ and the capacitance value of the capacitive element 12 is 10 pF, the time constant T is $T=R\times C=10$ M$\Omega \times 10$ pF$=1$ μsec, so that the period of time during which the clamp MOS transistor 14 is open is about 1 μsec.

When an ESD surge (high voltage pulse) is applied to the ESD protection circuit 10, a through current flows through the series RC circuit of the resistive element 11 and the capacitive element 12, so that the voltage level of the input end of the CMOS inverter 13 changes from a high level to a low level. When the voltage level of the input end of the CMOS inverter 13 changes from a high level to a low level, a high-level signal (voltage) is applied from the CMOS inverter 13 to the gate of the clamp MOS transistor 14.

When the high-level signal (voltage) is applied to the gate of the clamp MOS transistor 14, the clamp MOS transistor 14 is put into a conductive state, so that an ESD surge current flows through the drain-source channel of the clamp MOS transistor 14. An ESD surge current is thus allowed to flow through the drain-source channel of the clamp MOS transistor 14, whereby the ESD protection circuit 10 shown in FIG. 9 can protect the internal circuit 20 from a surge of ESD.

In order to enhance the discharge ability of the ESD protection circuit, it is necessary to increase the drive current of the power clamp MOS transistor. However, as described above, it is necessary to change the size in order to increase the drive current. The drive current can be increased by decreasing the gate length, increasing the gate width, or the like.

However, the decrease of the gate length or the increase of the gate width causes off-state leakage (standby leakage) during normal operations except for an ESD operation. Off-state leakage leads to an increase in current consumption. Therefore, there is a trade-off between the increase of the drive current of a power clamp MOS transistor and the occurrence of off-state leakage.

Under these circumstances, the present discloser has studied a protection element in which standby leakage can be reduced while a sufficient drive current can be ensured for a power clamp MOS transistor. As a result, the present discloser has devised a protection element in which standby leakage can be reduced while a sufficient drive current can be ensured for a power clamp MOS transistor. Such a protection element will be described below.

[1.2. Circuit Configuration Example]

Next, a circuit configuration example of an ESD protection circuit including a protection element according to an embodiment of the present disclosure will be described. FIG. 1 is an illustrative diagram showing a circuit configuration example of an ESD protection circuit 100 according to an embodiment of the present disclosure. The circuit configuration example of the ESD protection circuit 100 according to according to an embodiment of the present disclosure will now be described.

The ESD protection circuit 100 shown in FIG. 1, which is a circuit for protecting an internal circuit 120 from a surge of ESD, has a resistive element 101, a capacitive element 102, a CMOS inverter 103, a clamp MOS transistor 104, and a diode 105, between a power supply line 1 and a ground line 2. The power supply line 1 is supplied with a power supply voltage Vdd, and the ground line 2 is coupled to a ground terminal and has a ground potential.

The clamp MOS transistor 104 and the diode 105 correspond to an example of a protection element of the present disclosure. Also, the diode 105 corresponds to an example of a potential increasing circuit of the present disclosure.

The resistive element 101 can include, for example, a resistive element or MOSFET (variable resistive device) formed of a material, such as polysilicon or the like, as with the resistive element 11 of FIG. 9. In this embodiment, the resistive element 101 includes, for example, a resistive element formed of polysilicon, i.e., a resistive element having a resistance value which is constant irrespective of the presence or absence of occurrence of ESD. Note that, as the resistive element formed of polysilicon, the gate electrode of a MOSFET formed of polysilicon may be used, for example.

The capacitive element 102 includes a capacitive element which is less bias-dependent, as with the capacitive element 102 of FIG. 9. For example, the capacitive element 102 may include a capacitive element which employs as a capacitor a gate insulating film of a MOS transistor (e.g., an accumulation MOS transistor), a capacitive element which employs as a capacitor an insulating film between interconnection layers, or the like.

The resistance value of the resistive element 101 and the capacitance value of the capacitive element 102 may be set as appropriate so that the time constant of a series RC circuit of the resistive element 101 and the capacitive element 102 has a desired value, taking into account an application of the ESD protection circuit 100, a discharge phenomenon that is expected, or the like.

As an example, the resistance value of the resistive element 101 may be set within the range of, for example, about 1000Ω to 10 MΩ as appropriate. Also, the capacitance value of the capacitive element 102 may be set within the range of, for example, about 1 pF to 10 pF as appropriate. Needless to say, the resistance value of the resistive element 101 and the capacitance value of the capacitive element 102 are not limited to those value ranges.

The CMOS inverter 103 inverts the potential (voltage signal) of a coupling point between the resistive element 101 and the capacitive element 102. Thereafter, the CMOS inverter 13 applies the inverted potential to the gate of the clamp MOS transistor 104.

The clamp MOS transistor 104 includes an N-channel MOSFET. The drain, source, and gate of the clamp MOS transistor 104 are coupled to the power supply line 1, the anode of the diode 105, and the output of the CMOS inverter 103, respectively. Also, the drain and well of the clamp MOS transistor 14 are coupled together. The coupling of the gate and the well imparts the clamp MOS transistor 104 an increased discharge resistance during occurrence of ESD.

In the ESD protection circuit 100 shown in FIG. 1, the diode 105 is coupled between the source of the clamp MOS transistor 104 and the ground line 2, in addition to the ESD protection circuit 10 shown in FIG. 9. The diode 105 is arranged so that the forward direction thereof is a direction in which a current flows from the clamp MOS transistor 104 to the ground line 2.

The diode 105 provided in the ESD protection circuit 100 shown in FIG. 1 is provided in order to increase the potential of the source of the clamp MOS transistor 104 by a predetermined amount from the potential (ground potential) of the ground line 2. In the ESD protection circuit 100 shown in FIG. 1, the potential of the substrate is equivalently decreased by the potential of the source of the clamp MOS transistor 104 being increased from the ground potential by the diode 105. The decrease of the potential of the substrate can decrease an off-state leakage current in the ESD protection circuit 100 shown in FIG. 1.

Note that, as described below, the diode 105 may be formed on the same chip on which the clamp MOS transistor 104 is provided, or may be formed on a chip different from that of the clamp MOS transistor 104. Also, when the diode 105 is formed on the same chip on which the clamp MOS transistor 104 is provided, the diode 105 may be formed as a parasitic diode of the capacitive element 102.

Figure 2:
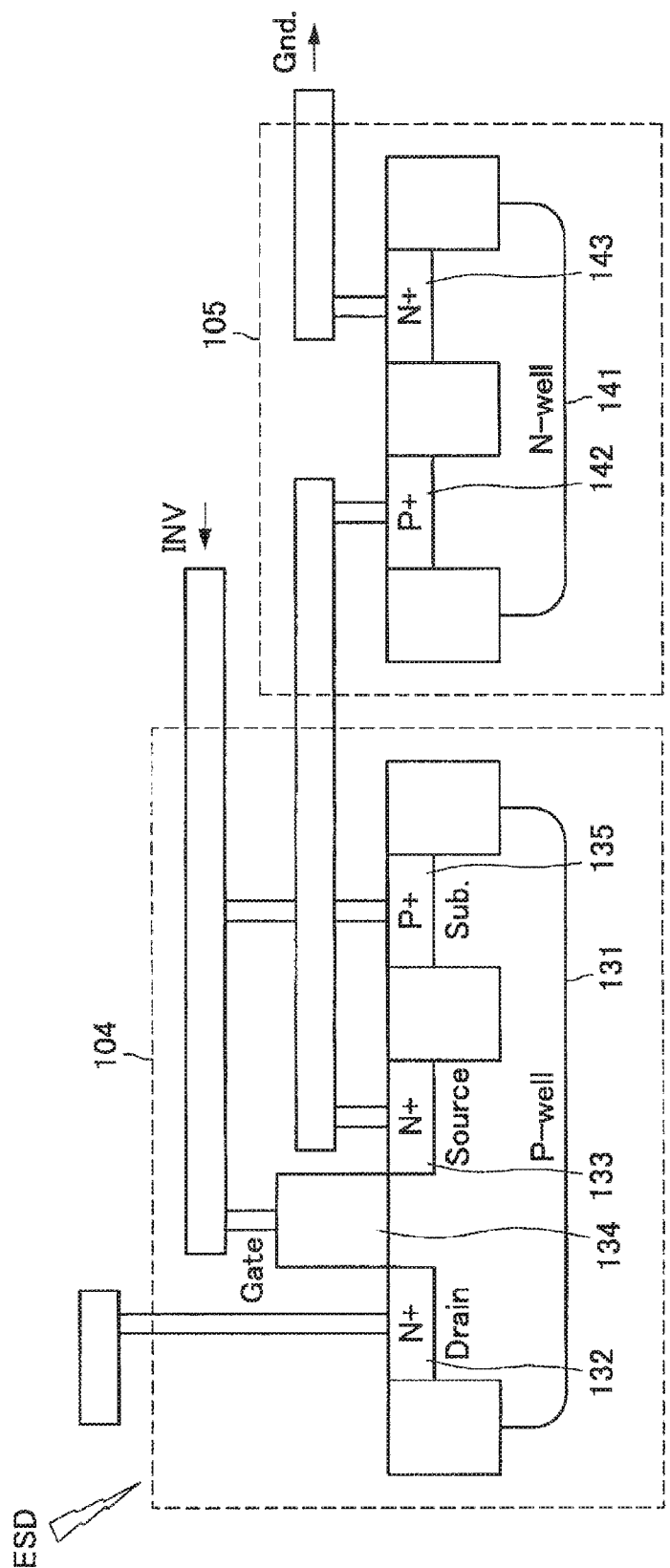
FIG. 2 is an illustrative diagram showing a cross-sectional view of the ESD protection circuit 100 shown in FIG. 1.
Figure 3:
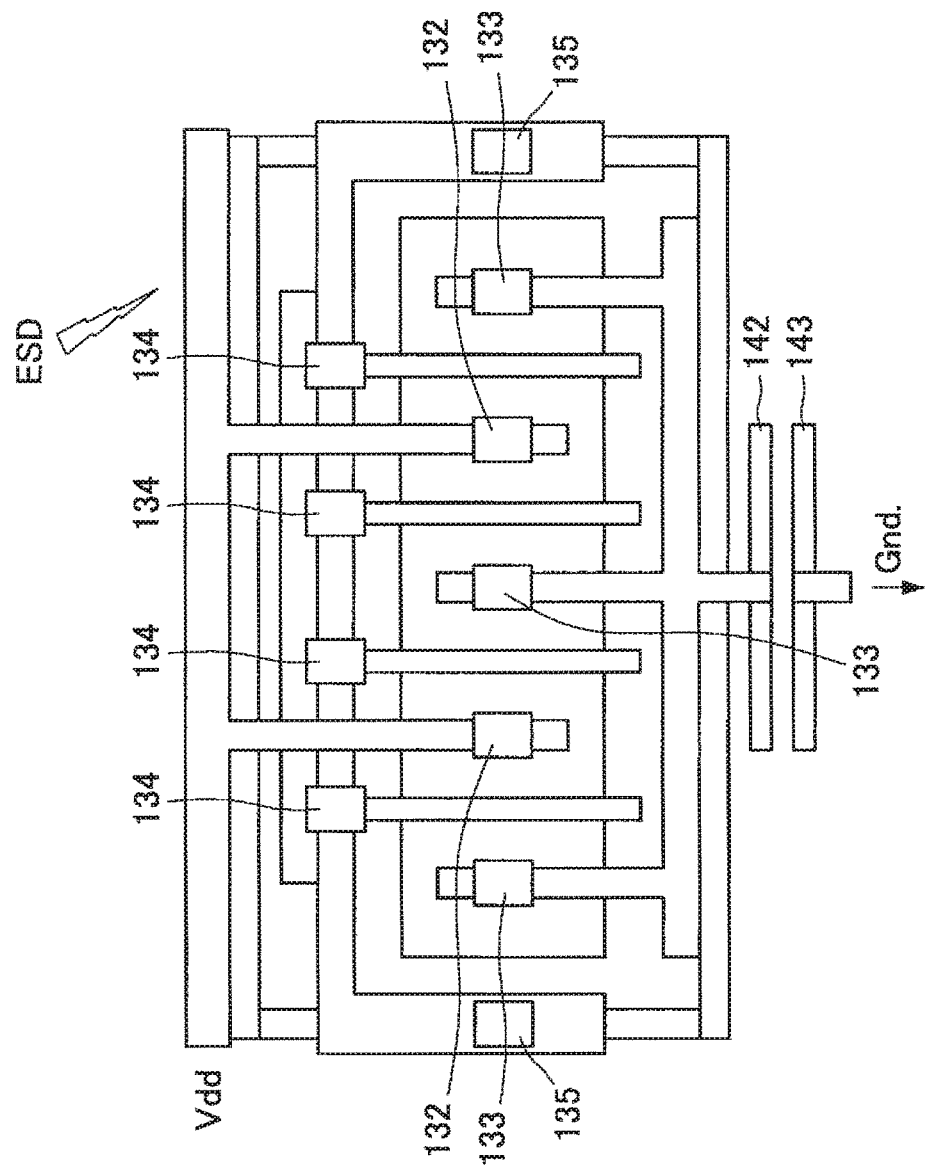
FIG. 3 is an illustrative diagram showing a plan view of the ESD protection circuit 100 shown in FIG. 1.

FIG. 2 is an illustrative diagram showing a cross-sectional view of the ESD protection circuit 100 shown in FIG. 1. Also, FIG. 3 is an illustrative diagram showing a plan view of the ESD protection circuit 100 shown in FIG. 1. Note that, in the diagram shown in FIG. 2, the CMOS inverter 103 is not shown.

The resistive element 101 is formed of a conductive material, such as polysilicon or the like. Also, the capacitive element 102 includes a well (diffusion layer) 121 formed in a predetermined region of the substrate, and a gate oxide film 122 formed on the well 121. The well 121 includes an impurity layer of the N-type carrier conductivity type. The coupling point between the resistive element 101 and the capacitive element 102 is coupled to the CMOS inverter 103. Also, the well of the capacitive element 102 is coupled to the ground line 2.

The clamp MOS transistor 104 includes a well (diffusion layer) 131 formed in a predetermined region of the substrate, and a drain 132 and a source 133 which are provided and buried in one surface of the well 131. The well 131 includes an impurity layer of the P-type carrier conductivity type, and the drain 132 and the source 133 both include an impurity layer of the N-type carrier conductivity type.

The clamp MOS transistor 104 includes a gate 134 which is formed on a surface of the well 131 in a region between the drain 132 and the source 133. Note that the gate 134 may be formed of a conductive material, such as polysilicon or the like. Also, the gate 134 is coupled to a well terminal 135 of the clamp MOS transistor 104.

The diode 105 includes a well 141 formed in a predetermined region of the substrate, and a cathode 142 and an anode 143 which are provided and buried in one surface of the well 141.

In the ESD protection circuit 100 according to an embodiment of the present disclosure has a circuit configuration as shown in FIG. 1, an increase in current due to off-state leakage can be reduced while a sufficient drive current can be ensured during an ESD operation.

In the foregoing, a circuit configuration example of the ESD protection circuit 100 according to an embodiment of the present disclosure has been described with reference to FIG. 1. Next, an operation example of the ESD protection circuit 100 according to an embodiment of the present disclosure will be described.

[1.3. Operation Example]

When the ESD protection circuit 100 is on standby, i.e., there is not an occurrence of ESD, the output of the CMOS inverter 103 is at a low level. Therefore, a voltage signal having a low level is input to both the gate and well of the clamp MOS transistor 104. Therefore, the drain-source channel of the clamp MOS transistor 104 is closed (off state).

When the clamp MOS transistor 104 is in the off state, only an off-state leakage current flows through the clamp MOS transistor 104. When the clamp MOS transistor 104 is in the off state, the presence of the diode 105 between the source of the clamp MOS transistor 104 and the ground line 2 increases the potential of the source of the clamp MOS transistor 104 by the built-in potential Vbi of the diode 105.

The effect of an increase in the potential of the source of the clamp MOS transistor 104, which is similar to a decrease in the potential of the substrate, increases the threshold voltage Vth of the clamp MOS transistor 104. Therefore, by coupling the diode 105 to the source of the clamp MOS transistor 104, the amount of an off-state leakage current flowing through the clamp MOS transistor 104 during the off state of the clamp MOS transistor 104 can be reduced.

Therefore, the ESD protection circuit 100 according to an embodiment of the present disclosure has the effect of preventing an ESD surge current from flowing into the internal circuit 120 while reducing an increase in current due to off-state leakage. An operation in a case where ESD occurs in the ESD protection circuit 100 according to an embodiment of the present disclosure will be specifically described.

Figure 4:
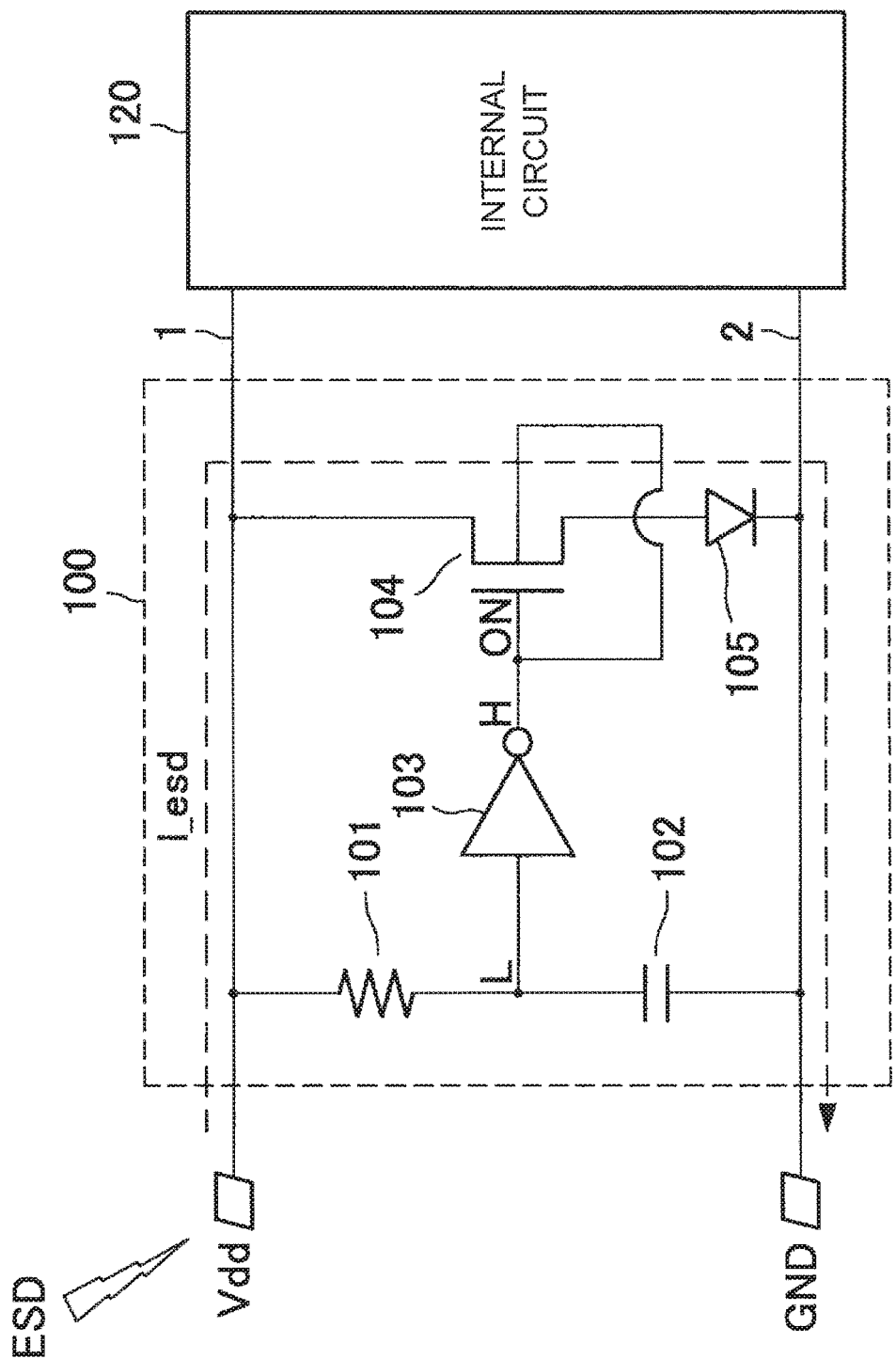
FIG. 4 is an illustrative diagram showing the potential level of each coupling point in a case where ESD occurs in the ESD protection circuit 100 shown in FIG. 1.

FIG. 4 is an illustrative diagram showing an operation, i.e., the potential level of each coupling point, in a case where ESD occurs in the ESD protection circuit 100 according to an embodiment of the present disclosure. When ESD occurs in the ESD protection circuit 100, a through current (transient current) instantaneously flows through the series RC circuit of the resistive element 101 and the capacitive element 102.

When a through current flows through the series RC circuit, the potential of the coupling point between the resistive element 101 and the capacitive element 102 becomes closer to the ground potential. In other words, the potential of the coupling point between the resistive element 101 and the capacitive element 102 changes from a high level to a low level.

When the potential of the coupling point between the resistive element 101 and the capacitive element 102 changes from a high level to a low level, the low-level potential is converted by the CMOS inverter 103 into a high-level potential, which is output.

Thereafter, the CMOS inverter 103 outputs the high-level potential to the gate of the clamp MOS transistor 104, so that the drain-source channel of the clamp MOS transistor 104 is open (on state).

When the clamp MOS transistor 104 in the on state, an ESD surge current I_esd flows from the power supply line 1 into the ground line 2 through the clamp MOS transistor 104.

After the ESD surge current I_esd flows from the power supply line 1 into the ground line 2 through the clamp MOS transistor 104, the ESD surge current I_esd flows through the clamp MOS transistor 104 during a period of time corresponding to the time constant of the series RC circuit of the resistive element 101 and the capacitive element 102.

Therefore, in the ESD protection circuit 100 according to this embodiment, the ESD surge current I_esd is thus allowed to flow through the channel path of the clamp MOS transistor 104, whereby, during occurrence of ESD, the ESD surge current I_esd is prevented from flowing into the internal circuit 120, and therefore, the internal circuit 120 can be protected.

The ESD protection circuit 100 according to an embodiment of the present disclosure can perform the above operation to ensure a sufficient drive current during an ESD operation.

Also, in the ESD protection circuit 100 according to an embodiment of the present disclosure, the diode 105 is provided between the source of the clamp MOS transistor 104 and the ground line 2, whereby an increase in current due to off-state leakage can be reduced.

[1.4. Modification]

(1) First Modification

Thus, in the ESD protection circuit 100 in which the diode 105 is provided between the source of the clamp MOS transistor 104 and the ground line 2, a sufficient drive current can be ensured during an ESD operation, and an increase in current due to off-state leakage can be reduced.

However, the addition of the diode 105 between the source of the clamp MOS transistor 104 and the ground line 2 leads to an increase in circuit area.

With the above in mind, in a first modification, shown is an example in which a diode 105 is employed which is formed on a chip different from that on which the clamp MOS transistor 104 is formed, and the chip on which the clamp MOS transistor 104 is formed and the chip on which the diode 105 is formed are put on top of each other, whereby the area efficiency of the ESD protection circuit 100 is increased.

Figure 5:
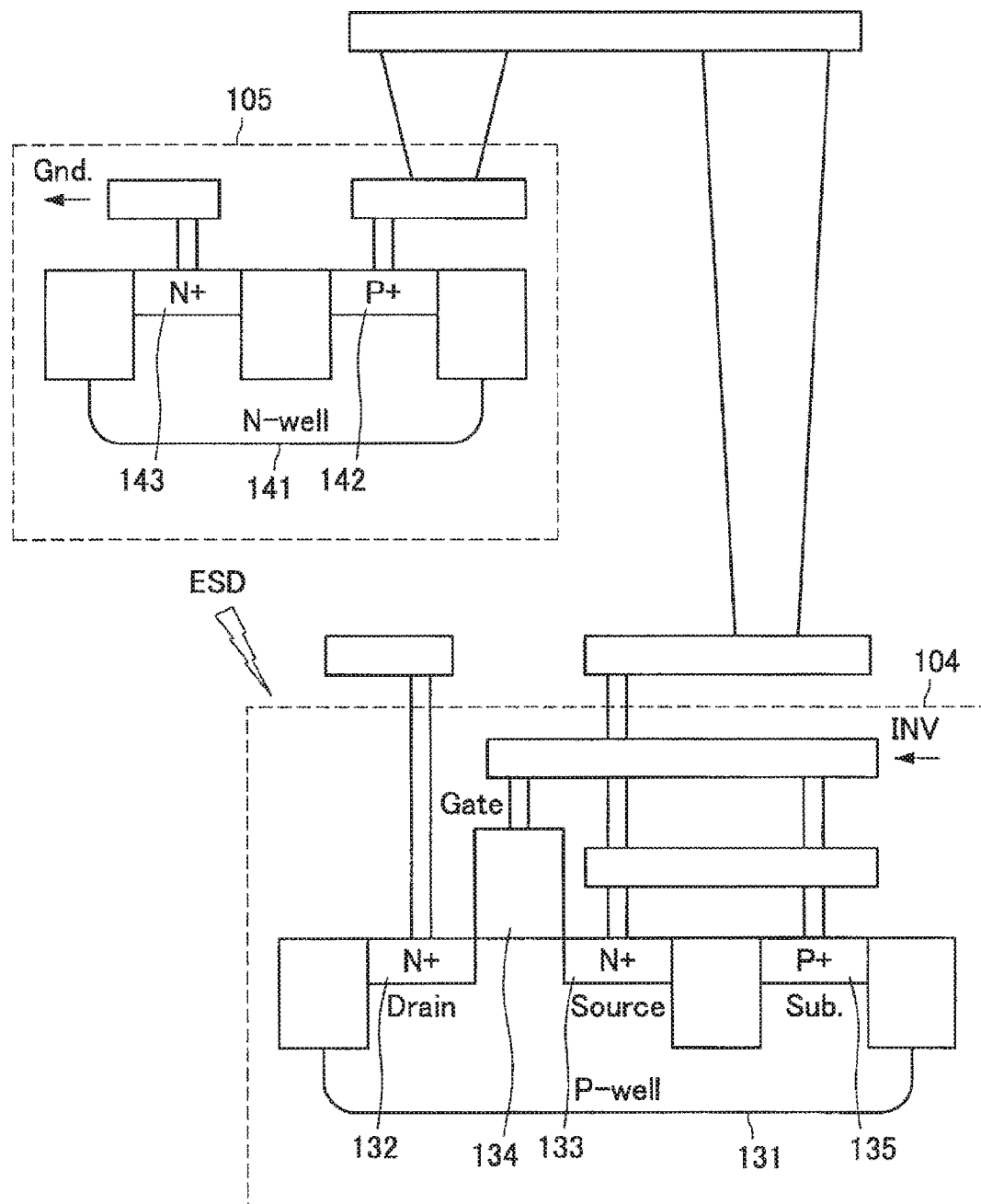
FIG. 5 is an illustrative diagram showing a modification of an embodiment of the present disclosure.
Figure 6:
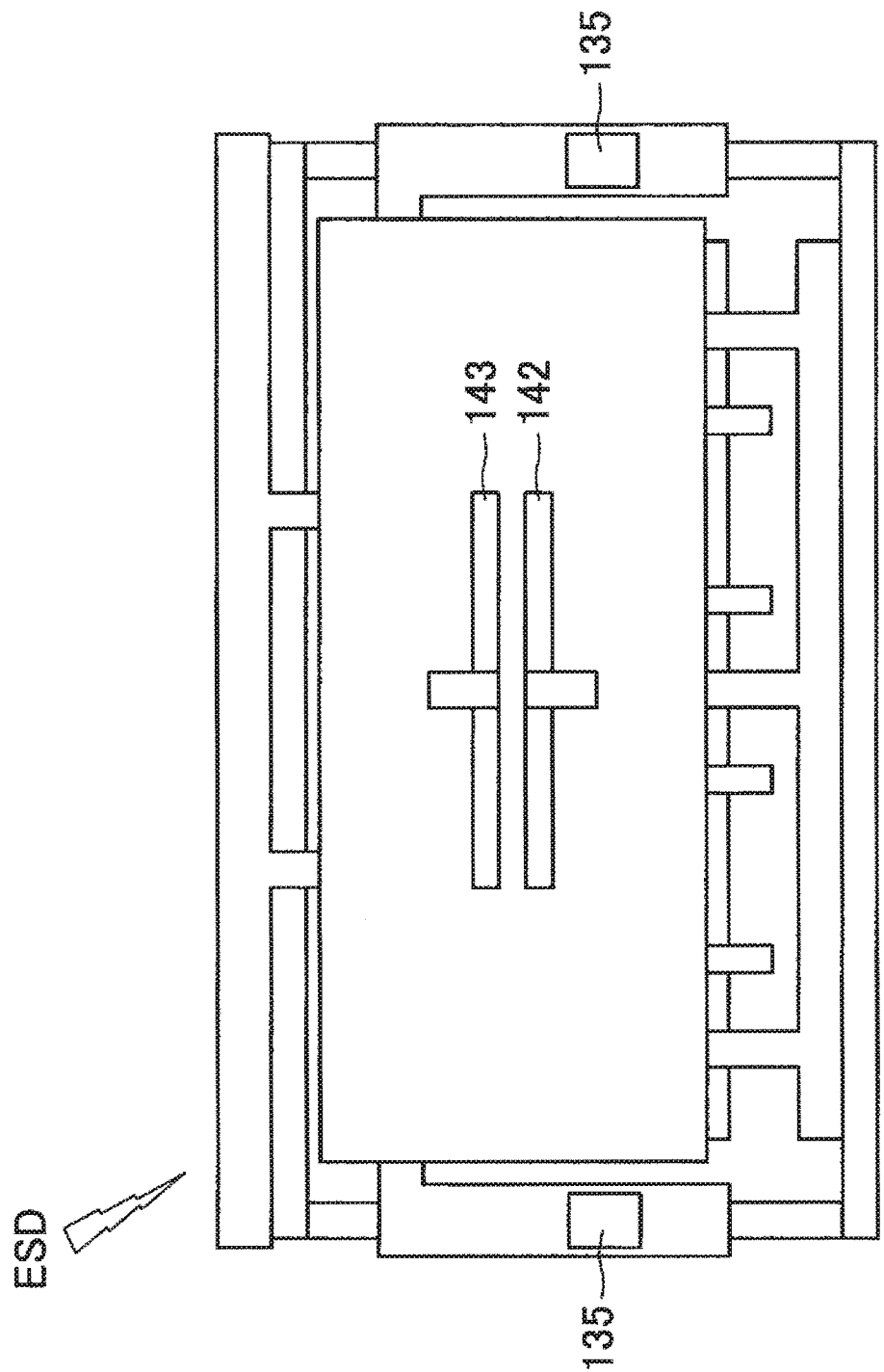
FIG. 6 is an illustrative diagram showing a modification of an embodiment of the present disclosure.

FIG. 5 and FIG. 6 are illustrative diagrams showing a modification of the embodiment of the present disclosure. FIG. 5 is a cross-sectional view of the ESD protection circuit 100 in which a diode 105 is employed which is formed on a chip different from that on which the clamp MOS transistor 104 is formed, and the chip on which the clamp MOS transistor 104 is formed and the chip on which the diode 105 is formed are put on top of each other. FIG. 6 is a plan view of the ESD protection circuit 100 shown in FIG. 5. Note that the CMOS inverter 103 is not shown in FIG. 5.

A through plug in the multiplayer chip is equipped with a protection diode for protecting a transistor from antenna damage during a process. However, after the end of a transistor formation process, the protection diode itself becomes unnecessary.

In this case, the protection diode which is no longer necessary is used as the diode 105 of the ESD protection circuit 100 according to this embodiment, i.e., that diode which is necessary during the process can be used for ESD. Therefore, the ESD protection circuit 100 shown in FIG. 5 and FIG. 6 obtains the effect of saving the area.

Thus, in the ESD protection circuit 100 shown in FIG. 5 and FIG. 6, the chip on Which the clamp MOS transistor 104 is provided and the chip on which the diode 105 is formed are put on top of each other, whereby an increase in circuit area as viewed from above can be reduced. Also, in the ESD protection circuit 100 shown in FIG. 5 and FIG. 6, a sufficient drive current can be ensured during an ESD operation, and an increase in current due to off-state leakage can be reduced, while an increase in circuit area as viewed from above can be reduced.

(2) Second Modification

In a second modification, shown is an example in which the diode 105 is formed as a parasitic diode of the capacitive element 102, whereby the area efficiency of the ESD protection circuit 100 is increased. Specifically, the diode 105 is formed using the well 121 of the capacitive element 102, whereby the area efficiency of the ESD protection circuit 100 is increased.

Figure 7:
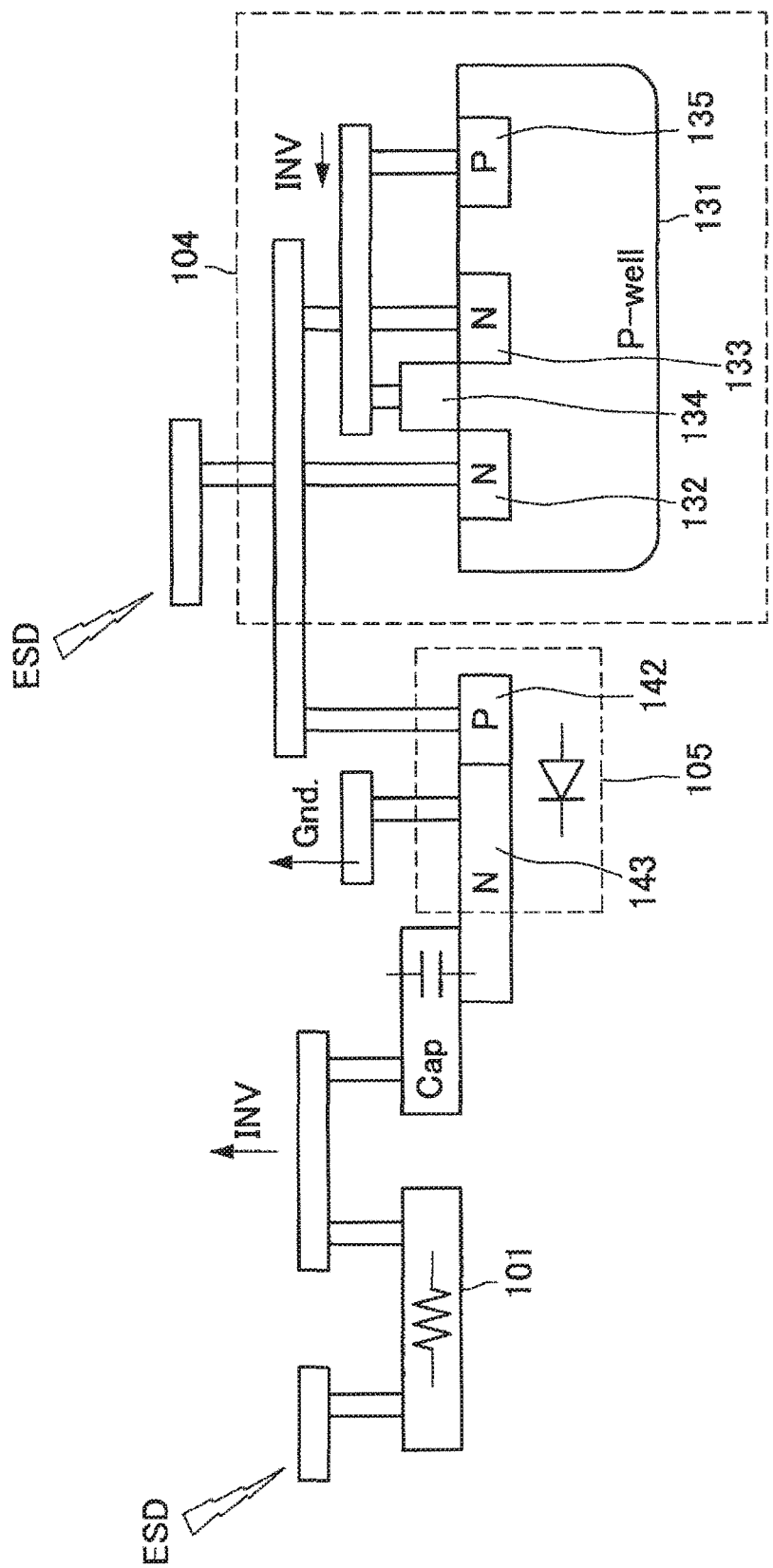
FIG. 7 is an illustrative diagram showing a modification of an embodiment of the present disclosure.
Figure 8:
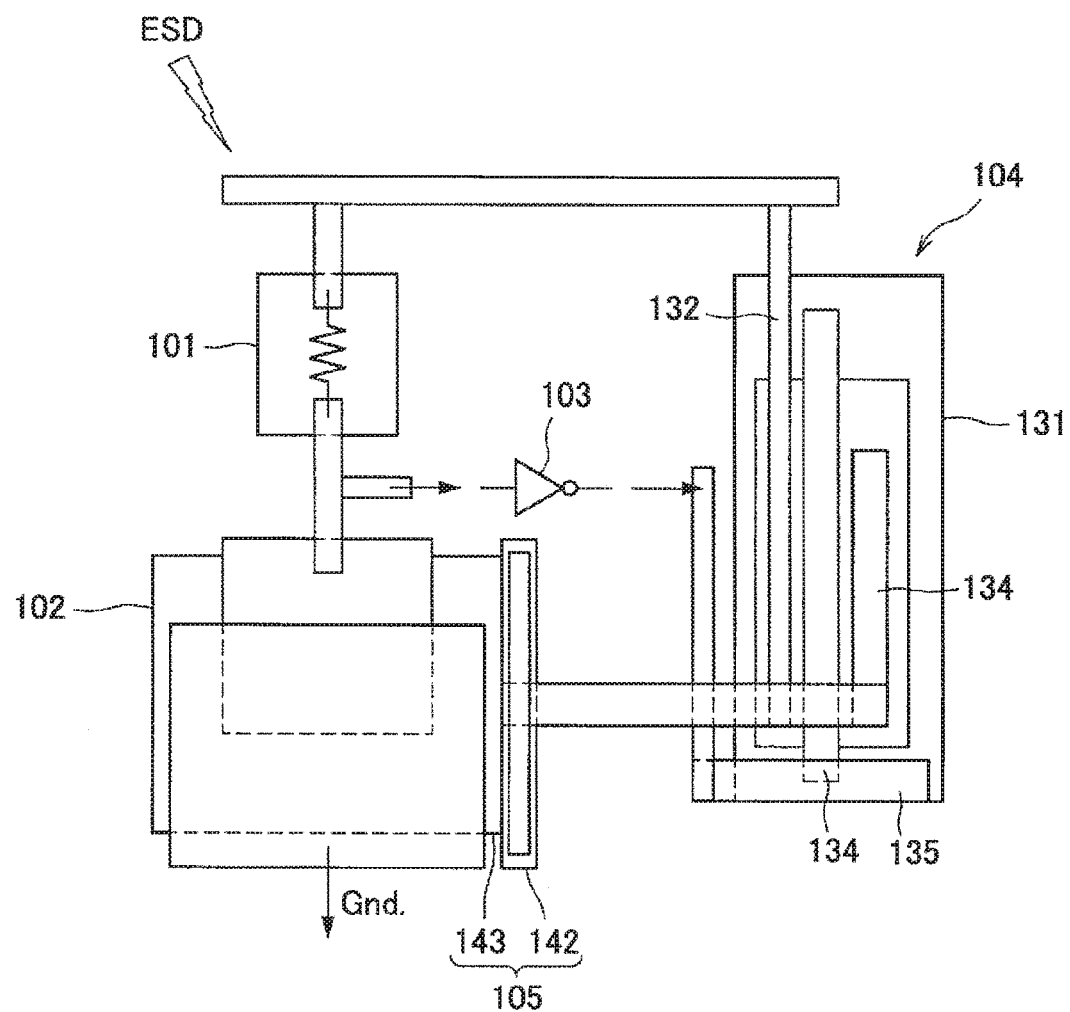
FIG. 8 is a plan view of the ESD protection circuit 100 shown in FIG. 7.

FIG. 7 is an illustrative diagram showing a modification of the embodiment of the present disclosure. FIG. 7 is a cross-sectional view of the ESD protection circuit 100 in which the diode 105 is formed as a parasitic diode of the capacitive element 102. FIG. 8 is a plan view of the ESD protection circuit 100 shown in FIG. 7.

As shown in FIG. 7 and FIG. 8, if the diode 105 is formed as a parasitic diode of the capacitive element 102, the N-channel diffusion layer can be shared, so that, in the ESD protection circuit 100, an increase in the area of the diode 105 can be reduced, and therefore, the area efficiency can be increased.

Note that the ESD protection circuit 100 may include a plurality of diodes 105 connected in series. Thus, in the ESD protection circuit 100, a plurality of diodes 105 may be connected in series so that the potential of the diffusion layer coupled to the ground line of the clamp MOS transistor 104 is increased from the potential of the ground line. In this case, in the ESD protection circuit 100, one of the plurality of diodes 105 connected in series may be formed as a parasitic diode of the capacitive element 102.

Specifically, in the plan view of the ESD protection circuit 100 shown in FIG. 8, one or more diodes may be formed in a stage preceding or following the diode formed as a parasitic diode of the capacitive element 102.

2. Conclusion

As described above, according to an embodiment of the present disclosure, provided is the ESD protection circuit 100 in which an increase in current due to off-state leakage can be reduced while a sufficient drive current can be ensured during an ESD operation.

In the ESD protection circuit 100 according to an embodiment of the present disclosure, the diode 105 is coupled between the source of the clamp MOS transistor 104 and the ground line 2. The diode 105 is arranged so that the forward direction thereof is a direction in which a current flows from the clamp MOS transistor 104 to the ground line 2.

In the ESD protection circuit 100 according to an embodiment of the present disclosure, the potential of the source of the clamp MOS transistor 104 is increased from the ground potential by the diode 105. The potential of the substrate is equivalently decreased by the potential of the source of the clamp MOS transistor 104 being increased from the ground potential by the diode 105. The decrease of the potential of the substrate can decrease an off-state leakage current in the ESD protection circuit 100 according to an embodiment of the present disclosure.

Therefore, in the ESD protection circuit 100 according to an embodiment of the present disclosure, by providing the diode 105 between the source of the clamp MOS transistor 104 and the ground line 2, an increase in current due to off-state leakage can be reduced while a sufficient drive current can be ensured during an ESD operation, whereby an increase in power consumption can be reduced.

Note that although, in the above embodiment, an example in which a single CMOS inverter 103 is provided in a stage preceding the clamp MOS transistor 104 has been described, the present disclosure is not limited to this. For example, at least three and an odd number of CMOS inverters may be provided in stages preceding the clamp MOS transistor 104, and may be connected in cascade.

Also, although, in the above embodiment, an example in which an inverter circuit includes a CMOS inverter has been described, the present disclosure is not limited to this. An inverter circuit having any configuration that performs an operation similar to that of a CMOS inverter can be employed.

Also, although, in the above embodiment, the potential of the source of the clamp MOS transistor 104 is increased from the ground potential by the diode 105, the present disclosure is not limited to this. Any device that can increase the potential of the source of the clamp MOS transistor 104 from the ground potential can be employed.

Also, although, in the above embodiment, an example in which the power supply voltage Vdd is supplied to the power supply line has been described, the present disclosure is not limited to this. For example, even when the power supply voltage Vdd is not supplied to the power supply line, the ESD protection circuit 100 of this embodiment operates in a similar manner. Specifically, even when the input end of the power supply line is open (the ground is fixed), the ESD protection circuit 100 operates in a manner similar to that of the above embodiment during occurrence of ESD.

Note that the power supply voltage Vdd may not be supplied to the power supply line, for example, when the ESD protection circuit 100 is being inspected or tested, or when power is not being supplied to the ESD protection circuit 100 mounted on an electronic device or the like.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art based on the description of this specification.

Additionally, the present technology may also be configured as below.

(1)
A protection element including:
a clamp MOS transistor that has a drain coupled to a power supply line and a source coupled to a ground line; and
a potential increasing circuit that increases a potential of a diffusion layer at the ground line side of the clamp MOS transistor, more than a potential of the ground line.

(2)
The protection element according to (1),
wherein the potential increasing circuit includes a diode.

(3)
The protection element according to (2),
wherein the diode is a diode formed in a layer different from a layer in which the clamp MOS transistor is formed.

(4)
The protection element according to (2),
wherein the diode is a parasitic diode of a capacitive element.

(5)
The protection element according to (2),
wherein a plurality of the diodes are connected in series.

(6)
The protection element according to (5),
wherein one of the plurality of diodes is a parasitic diode of an element different from the clamp MOS transistor.

(7)
The protection element according to any of (1) to (6),
wherein the clamp MOS transistor has a gate potential and a well potential that are electrically coupled together.

(8)
A protection circuit including:
a clamp MOS transistor that has a drain coupled to a power supply line and a source coupled to a ground line;
a potential increasing circuit that increases a potential of a diffusion layer at the ground line side of the clamp MOS transistor, more than a potential of the ground line;
a resistive element and a capacitive element that are coupled between the power supply line and the ground line; and
an inverter that has an input coupled between the resistive element and the capacitive element.

(9)
A semiconductor integrated circuit including:
a clamp MOS transistor that has a drain coupled to a power supply line and a source coupled to a ground line;
a potential increasing circuit that increases a potential of a diffusion layer at the ground line side of the clamp MOS transistor, more than a potential of the ground line;
a resistive element and a capacitive element that are coupled between the power supply line and the ground line;
an inverter that has an input coupled between the resistive element and the capacitive element; and
an internal circuit that is coupled between the power supply line and the ground line.

REFERENCE SIGNS LIST

1 power supply line
2 ground line
100 ESD protection circuit
101 resistive element
102 capacitive element
103 CMOS inverter
104 clamp MOS transistor
105 diode
120 internal circuit

What is claimed is:

1. A protection element comprising:
a clamp MOS transistor comprising a drain coupled to a power supply line and a source coupled to a ground line; and
a potential increasing circuit, wherein the potential increasing circuit increases a potential of a diffusion layer at a ground line side of the clamp MOS transistor, wherein the potential of the diffusion layer at the ground line side of the clamp MOS transistor is greater than a potential of the ground line, wherein a gate of the clamp MOS transistor is coupled to a well terminal of the clamp MOS transistor such that discharge resistance during an electrostatic discharge occurrence is increased.

2. The protection element according to claim 1, wherein the potential increasing circuit comprises a diode.

3. The protection element according to claim 2, wherein the diode is formed in a layer different from a layer in which the clamp MOS transistor is formed.

4. The protection element according to claim 2, wherein the diode is a parasitic diode of a capacitive element.

5. The protection element according to claim 1, wherein the potential increasing circuit comprises a plurality of diodes connected in series.

6. The protection element according to claim 5, wherein one or more of the plurality of diodes is a parasitic diode of an element different from the clamp MOS transistor.

7. The protection element according to claim 1, wherein the clamp MOS transistor has a gate potential and a well potential that are electrically coupled together.

8. A protection circuit comprising:
a clamp MOS transistor that has a drain coupled to a power supply line and a source coupled to a ground line;
a potential increasing circuit, wherein the potential increasing circuit increases a potential of a diffusion layer at a ground line side of the clamp MOS transistor, wherein the potential of the diffusion layer at the ground line side of the clamp MOS transistor is greater than a potential of the ground line, wherein a gate of the clamp MOS transistor is coupled to a well terminal of the clamp MOS transistor such that discharge resistance during an electrostatic discharge occurrence is increased;
a resistive element and a capacitive element that are coupled between the power supply line and the ground line; and
an inverter that has an input coupled between the resistive element and the capacitive element.

9. A semiconductor integrated circuit comprising:
a clamp MOS transistor that has a drain coupled to a power supply line and a source coupled to a ground line;
a potential increasing circuit, wherein the potential increasing circuit increases a potential of a diffusion layer at a ground line side of the clamp MOS transistor, wherein the potential of the diffusion layer at the ground line side of the clamp MOS transistor is greater than a potential of the ground line, wherein a gate of the clamp MOS transistor is coupled to a well terminal of the clamp MOS transistor such that discharge resistance during an electrostatic discharge occurrence is increased;

a resistive element and a capacitive element that are coupled between the power supply line and the ground line;

an inverter that has an input coupled between the resistive element and the capacitive element; and an internal circuit that is coupled between the power supply line and the ground line.

* * * * *